(12) United States Patent
Bauer et al.

(10) Patent No.: US 7,709,936 B2
(45) Date of Patent: May 4, 2010

(54) MODULE WITH CARRIER ELEMENT

(75) Inventors: Michael Bauer, Nittendorf (DE); Stephan Stoeckl, Schwandorf (DE)

(73) Assignee: Infineon Technologies AG, Munich (DE)

( * ) Notice: Subject to any disclaimer, the term of this patent is extended or adjusted under 35 U.S.C. 154(b) by 354 days.

(21) Appl. No.: 11/613,897

(22) Filed: Dec. 20, 2006

(65) Prior Publication Data

US 2008/0112141 A1    May 15, 2008

(30) Foreign Application Priority Data

Nov. 15, 2006   (DE) .................. 10 2006 053 922

(51) Int. Cl.
*H01L 21/00* (2006.01)

(52) U.S. Cl. .............. 257/669; 257/666; 257/676; 257/E23.021

(58) Field of Classification Search ............... 257/666, 257/676, 669, E23.021; 361/728
See application file for complete search history.

(56) References Cited

U.S. PATENT DOCUMENTS

| | | | |
|---|---|---|---|
| 5,005,282 A | 4/1991 | Rose | |
| 5,365,655 A | 11/1994 | Rose | |
| 5,508,231 A | 4/1996 | Ball et al. | |
| 6,025,640 A * | 2/2000 | Yagi et al. | 257/666 |
| 6,262,368 B1 | 7/2001 | Riener et al. | |
| 6,388,311 B1 * | 5/2002 | Nakashima et al. | 257/676 |
| 2003/0038358 A1 | 2/2003 | Chiu et al. | |
| 2005/0263861 A1 | 12/2005 | Ahn et al. | |
| 2006/0006505 A1 | 1/2006 | Chiang et al. | |

FOREIGN PATENT DOCUMENTS

DE   689 10 385    5/1994
JP     07045778 A  *  2/1995

* cited by examiner

*Primary Examiner*—Roy K Potter
(74) *Attorney, Agent, or Firm*—Patterson & Sheridan, L.L.P.

(57) ABSTRACT

The invention relates to a module comprising a carrier element having a lower stiffness or a different structure in a first region than in a second region, and also comprising a component applied to the carrier element. The component and the first region are connected to one another by a wire connection covered by a material.

21 Claims, 4 Drawing Sheets

MODULE WITH CARRIER ELEMENT

CROSS-REFERENCE TO RELATED APPLICATIONS

This application claims foreign priority benefits under 35 U.S.C. §119 to co-pending German patent application number DE 10 2006 053 922.2, filed 15 Nov. 2006. This related patent application is herein incorporated by reference in its entirety.

BACKGROUND OF THE INVENTION

1. Field of the Invention

The invention relates to a module comprising a carrier element and a component applied on the carrier element. The invention additionally relates to a method for producing such a module.

2. Description of the Related Art

The functionality of many components is impaired by electrical potential differences that may occur between the component and the outside world, and also by electric currents caused thereby. These undesirable potential differences may be caused for example by electromagnetic interference or an accumulation of excess charges on the component. The potential differences are generally suppressed by providing a wire connection which leads from the component to the carrier element and via which the excess charge can flow away.

SUMMARY OF THE INVENTION

In accordance with one configuration, a module comprises a carrier element and a component applied to the carrier element. The carrier element has a lower stiffness in a first region than in a second region. Furthermore, the component and the first region of the carrier element are connected to one another by a wire connection. The wire connection is covered by a material.

In accordance with a further configuration, a module comprises a carrier element having a length and width and also a component applied to the carrier element. The carrier element has a structure having a structure width that is less than the width of the component. Furthermore, the component and the structure of the carrier element are connected to one another by a wire connection. The wire connection is covered by a material.

In accordance with a further configuration, a module comprises a die pad and a component applied to the die pad. Furthermore, a cantilever is fixed to the die pad and connected to the component via a wire connection. The wire connection is covered by a material.

In accordance with a further configuration, a module comprises a die pad that is structured in its edge region and is connected to an external contact connection. A component is applied to the die pad and connected to the structured edge region of the die pad via a wire connection. The wire connection is covered by a material.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Modules comprising components and also methods for producing these modules are described below. The invention is independent of the type of component. In particular, the components may be electrical, electromechanical or electro-optical components of any type, e.g. integrated circuits, sensors, microelectromechanical components (MEMS) or laser diodes. The components may be produced on a semiconductor basis or be constructed on substrates of any type, e.g. a ceramic substrate, glass substrate, polymer or PCB. The components may be housed or unhoused.

The modules in each case comprise a carrier element, to which the components are applied. The carrier element may be constructed from one or more materials, e.g. a metal, a metal alloy or a polymer. The carrier element may be a die pad of a leadframe or comprise a die pad. The carrier element may be of homogeneous constitution, and may also have structures such as, for example, conductor tracks or a plurality of different layers. The carrier element may have a plurality of regions having different stiffnesses. The reason for the different stiffnesses of said regions may be arbitrary and stem for example from material properties or the structure of the regions.

The component is contact-connected by means of a wire connection. The wire connection enables an electrical connection between the component and, for example, a region of the carrier element or a cantilever which is fixed to the carrier element. The wire connection may be a bonding wire, by way of example.

Figure 1:
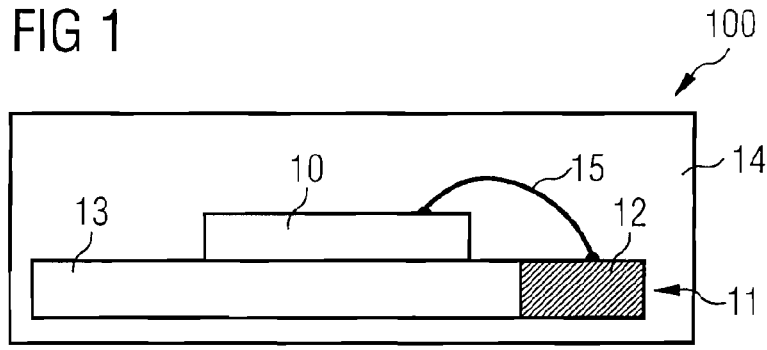
FIG. 1 shows a schematic illustration of a module 100 as an exemplary embodiment of the invention.

FIG. 1 illustrates a module 100 in cross section as an exemplary embodiment of the invention. The module 100 has a component 10, for example a semiconductor chip or an MEMS, and a carrier element 11. The carrier element 11 comprises at least two regions 12 and 13 having different stiffnesses. In the case of the module 100 illustrated in FIG. 1, the stiffness of the first region 12 is less than the stiffness of the second region 13. In this case, stiffness is understood as a variable from technical mechanics which describes a relationship between a force acting on a body and the deformation thereof. In particular, the stiffness of a body is determined by the geometrical form of said body and also its specific material properties. The component 10 is applied to the carrier element 11, in particular to the second region 13, and electrically connected to the first region 12 via a wire connection 15, e.g. a bonding wire.

The carrier element 11 may be produced for example from a metal, such as, e.g., aluminum, copper, iron or gold, or a metal alloy. As an alternative, the carrier element 11 may also be produced from an electrically conductive plastic or from a combination of the materials mentioned. An electrical conductivity of the carrier element 11 may furthermore be effected by an electrically conductive coating of an otherwise insulating carrier element 11. Furthermore, the carrier element 11 may be a metal carrier (a die pad)—produced from copper for example—of a leadframe or comprise such a metal carrier. In particular, the carrier element 11 may have an arbitrary geometrical form.

The wire connection 15 serves in particular to compensate for a potential difference between the component 10 and the carrier element 11. The potential difference may be caused for example by electromagnetic interference or an accumulation of charge on the component 10 or by arbitrary external influences. By means of the wire connection 15, a predetermined fixed potential, for example an earth potential, can be applied to the electrical potential of the component 10. As a result, an excess charge situated on the component 10 can flow away. The two regions 12 and 13 of the carrier element 11 may be electrically conductive throughout and have the same electrical potential. This potential is applied to the component 10 via the wire connection 15.

The wire connection 15 is covered with a potting material 14. The potting material 14 may be e.g. a plastic material or globe top or Turboplast. Furthermore, the component 10 and the entire carrier element 11 may be encapsulated with the potting material 14. The potting material 14 serves to protect the elements of the module 100 against ambient influences such as, for example, dirt, moisture or else mechanical impacts. Furthermore, the heat that arises during the operation of the component 10 can be at least partly dissipated by means of an increased thermal conductivity of the potting material 14.

Under certain circumstances, a delamination of the wire connection 15 from the carrier element 11 may occur during the operation of the module 100. A delamination of the wire connection 15 may be caused for example by different coefficients of expansion of the carrier element 11 and of the potting material 14. The module elements and the potting material 14 expand to different extents in the event of temperature fluctuations that occur for example during the operation of the module 100. On account of the different coefficients of expansion, cracks that lead to a delamination of the wire connection 15 from the carrier element 11 may occur between the potting material 14 and the carrier element 11. Such a delamination can be counteracted by means of a reduced stiffness of the first region 12 of the carrier element 11 since the carrier element 11 can concomitantly move with the potting material 14 during the expansion phase better in the first region 12, on account of the low stiffness, than the stiffer second region 13. Furthermore, if the carrier element 11 concomitantly moves with the potting material 14 in the region of the wire connection contact 15a in the event of thermal cycling, it is possible to prevent the wire connection 15 from being torn away from the carrier element 11 by the potting material 14 surrounding the wire connection 15.

The different stiffnesses of the regions 12 and 13 of the carrier element 11 can be achieved by different materials, by different geometrical structures or by combinations thereof. By way of example, the first region 12 may be structured to form a structure having a small structure width (e.g. a narrow beam or cantilever), with the result that the stiffness of the carrier element 11 is lower in this region than in the planar second region 13 on which the component 10 is applied.

The carrier element 11, or at least the second region 13 of the carrier element 11, is a carrier produced from a metal or an alloy, which carrier is also referred to as a die pad of a leadframe in the specialist literature.

The component 10 is adhesively bonded to the carrier element 11. With regard to the connection of the component 10 to the carrier element 11, it is furthermore possible to resort to any other mechanical, electrical or chemical die attach method desired.

Figure 2:
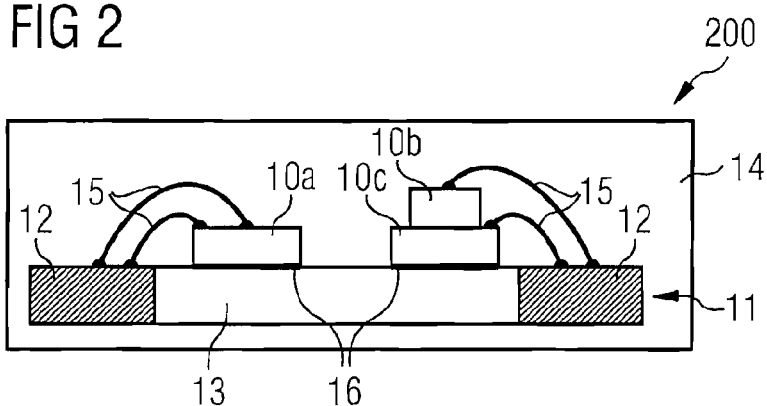
FIG. 2 shows a schematic illustration of a module 200 as a further exemplary embodiment of the invention.

FIG. 2 illustrates a module 200 as a further exemplary embodiment of the invention, which module, in contrast to the module 100, has two first regions 12 having a reduced stiffness in comparison with the second region 13.

Furthermore, a plurality of components 10a, 10b and 10c are applied to the carrier element 11. The components 10a to 10c may be arranged one alongside another or be stacked one above another on the carrier element 11. The fixing of the components 10a to 10c among one another and also to the carrier element 11 may be effected by means of an adhesive bonding method or some other die attach method.

Each of the components 10a to 10c may be connected to one of the first regions 12 of the carrier element 11 via a plurality of wire connections 15. This affords the advantage that in the case where one of the wire connections 15 is lost, potential equalization between the respective component 10a to 10c and the carrier element 11 is ensured by the remaining wire connections 15.

As in FIG. 1, in FIG. 2 as well the first regions 12 having a reduced stiffness are situated in the edge region of the carrier element 11.

The components 10a to 10c in FIG. 2 and also the carrier element 11 are isolated from one another by an insulating layer 16. Any desired insulator may be used as material for the insulating layer 16. In particular, the insulation may be effected by the adhesive that connects the components 10a to 10c and the carrier element 11 to one another.

Figure 3:
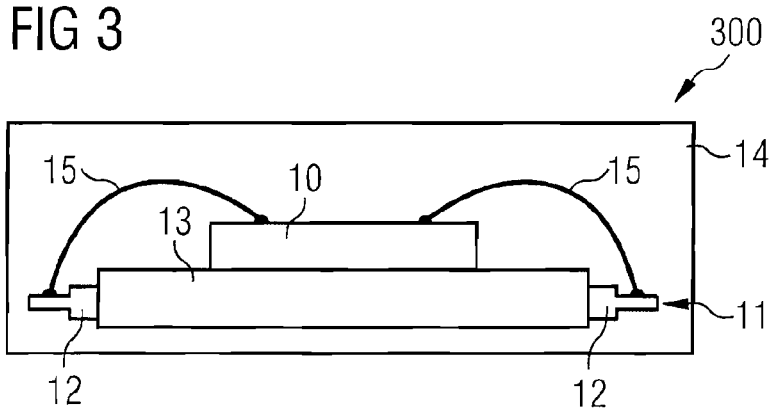
FIG. 3 shows a schematic illustration of a module 300 as a further exemplary embodiment of the invention.

FIG. 3 illustrates a module 300 as a further exemplary embodiment of the invention, in which module the carrier element 11 is formed as cantilevers 12 in the first regions 12. On account of their geometrical form, the cantilevers 12 have a lower stiffness than the second region 13 of the carrier element 11, which second region may be formed as an essentially rectangular plate, for example as a die pad. The reduced stiffness of the cantilevers 12, to which the wire connections 15 are fixed, prevents a delamination of the wire connection 15. In plan view, the module 300 may look for example like the module illustrated in FIG. 7.

The cantilevers 12 in FIG. 3 are essentially in bar-type form. In this case, the cross sections of the cantilevers 12 may assume any desired form, for example they may be circular or quadrangular. Furthermore, the cantilevers 12 shown in FIG. 3 comprise a step, as a result of which their cross-sectional area and hence also their stiffness are reduced at the ends remote from the second region 13.

At the locations at which the wire connections 15 are fixed to the cantilevers 12, the diameter of the cantilevers 12 in accordance with one configuration is approximately 1.5 to 2 times as large as the diameter of the wire connections 15.

In practice, in the course of adhesively bonding the component 10 onto the carrier element 11, it is possible for a bleed-out of the adhesive and an associated detachment of the wire connections 15 from the carrier element 11 to occur. The abovementioned thin, bar-type form of the cantilevers 12 reduces the probability of a delamination on account of a bleed-out of the adhesive. Furthermore, it is possible to dispense with additional complicated methods for fixing the potting material 14 to the module elements, such as, for example, safety bonds or adhesion-promoting coatings.

The carrier element 11 is a die pad produced from copper, for example. During the production of the module 300, the die pad 11 is held in position together with the pins, which can be used ultimately to produce an electrical connection of the component 10 externally, by means of a metal frame. In this case, the die pad 11 is connected to the metal frame via webs. Said webs connected to the die pad 11 may be used as cantilevers 12.

In FIG. 3, the cantilevers 12 are fixed to the sides of the second region 13, which is formed for example as a rectangular carrier plate, and are oriented parallel to the carrier plate 13. As an alternative, the cantilevers 12 may be fitted to any desired locations of the carrier plate 13 and be oriented in any desired directions, for example perpendicular to the carrier plate 13.

The connection between the cantilevers 12 and the carrier plate 13 may be effected in a variety of ways, for example by soldering, welding or plug connections. The cantilevers 12 may be produced from metals, alloys or other electrically conductive materials. Furthermore, the carrier plate 13 and the cantilevers 12 may be formed integrally.

Figure 4:
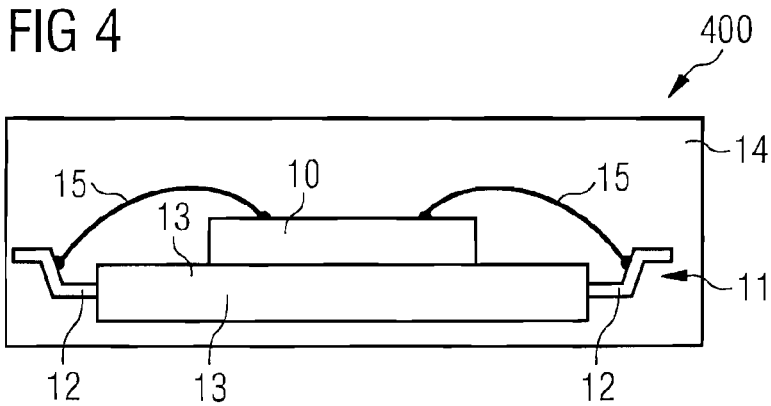
FIG. 4 shows a schematic illustration of a module 400 as a further exemplary embodiment of the invention.

FIG. 4 illustrates a module 400 as a further exemplary embodiment of the invention, in which module the cantilevers 12 are not worked in rectilinear fashion, but rather are in each case angled at one location. The angling of the cantilevers 12 may be effected in any desired direction and may be to any desired magnitude. Furthermore, the cantilevers 12 may be angled at a plurality of locations. In practice, in the event of temperature variations, no isotropic expansion of the potting material 14 and the module elements occurs, that is to say that lateral movements between potting material 14 and module elements occur in different spatial directions. An additional angling of the cantilevers 12 in different spatial directions additionally counteracts a detachment of the potting material 14 from the cantilevers 12.

Figure 5:
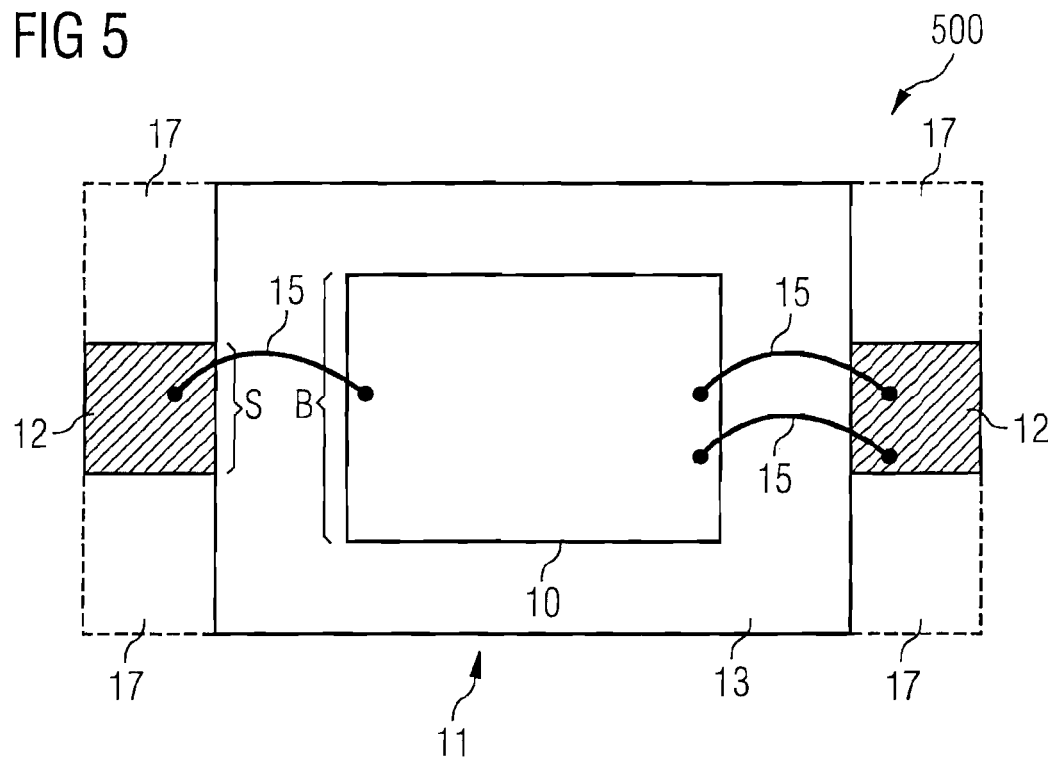
FIG. 5 shows a schematic illustration of a module 500 as a further exemplary embodiment of the invention.

FIG. 5 illustrates a module 500 in plan view as a further exemplary embodiment of the invention. The carrier element 11 of the module 500 is a plate having a reduced width in two edge regions, the first regions 12, in comparison with the central second region 13. On account of the smaller structure width S of the carrier element 11, which is less than the width B of the component 10, the stiffness of the first regions 12 is lower than that of the second region 13.

In particular, the structure width S of the carrier element 11 is less than 5 mm or 4 mm or 3 mm or 2 mm or 1 mm.

Figure 6:
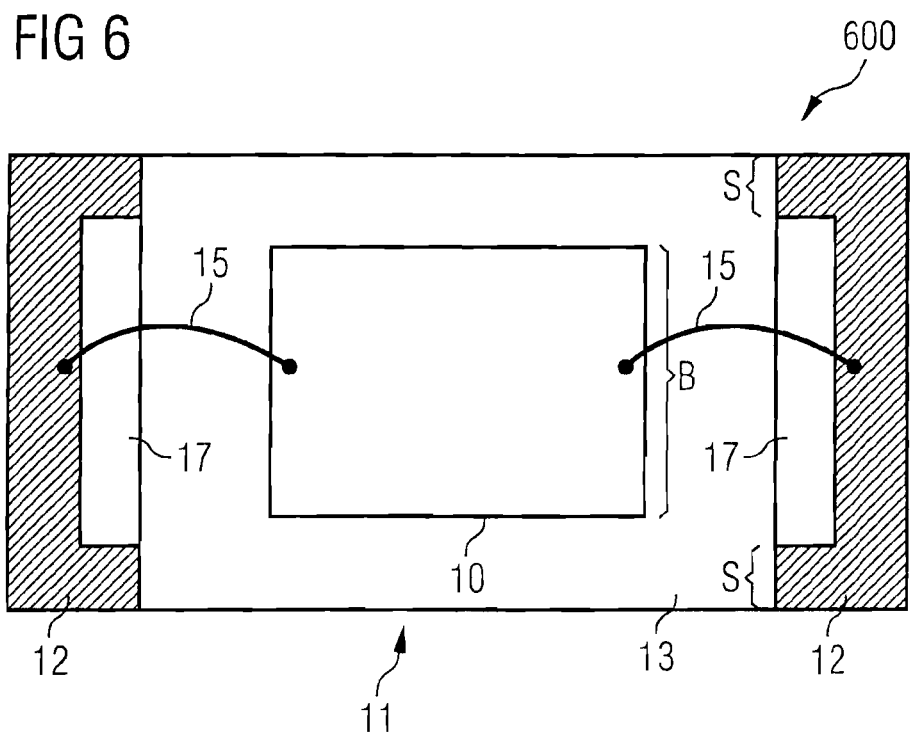
FIG. 6 shows a schematic illustration of a module 600 as a further exemplary embodiment of the invention.

FIG. 6 illustrates a module 600 in plan view as a further exemplary embodiment of the invention. The outer form of the carrier element 11 of the module 600 is essentially that of a rectangle, two material cutouts or holes 17 having been introduced into the carrier element 11. By way of example, the cutouts 17 may be produced by etching, milling or stamping out from the carrier element 11. On account of the cutouts 17, the first regions 12 have a lower stiffness in comparison with the second region 13.

While the carrier elements 11 shown in FIGS. 5 and 6 are formed integrally and the different stiffnesses of the regions 12 and 13 are achieved by means of different structures, the different stiffnesses can also be obtained by means of different materials. By way of example, the first region 12 may be produced from an electrically conductive plastic having a lower stiffness than the second region 13, which is produced from a metal or an alloy, by way of example. Since a bonding wire 15 is usually connected to the carrier element 11 by a welded connection, in this case the electrically conductive plastic must be metallized before the welding operation. For this purpose, the first region 12 may be coated with a gold layer, by way of example.

Figure 7:
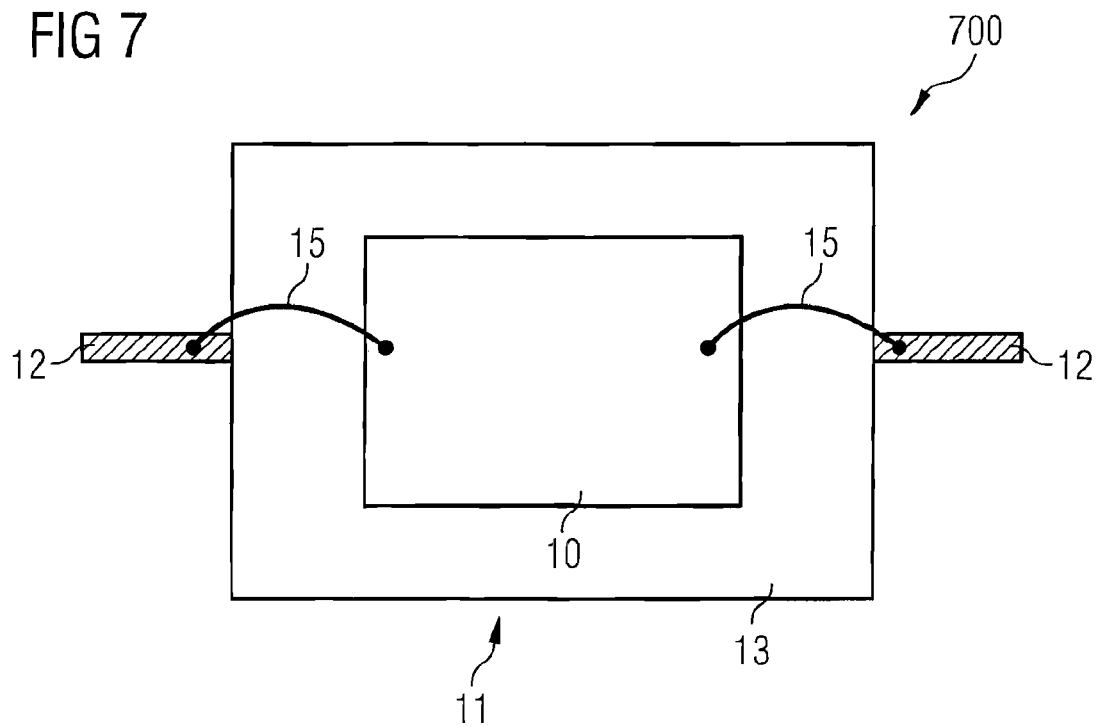
FIG. 7 shows a schematic illustration of a module 700 as a further exemplary embodiment of the invention.

FIG. 7 shows a module 700 in plan view as a further exemplary embodiment of the invention. In this case, the first region 12 having lower stiffness is provided in the form of a thin connecting pin 12. Said connecting pin 12 may either be produced separately and be fitted to the carrier element 11 after it has been produced, or be produced for example by stamping out from a region of the carrier element 11. The connecting pin 12 may be for example an external contact connection or a part thereof.

Figure 8:
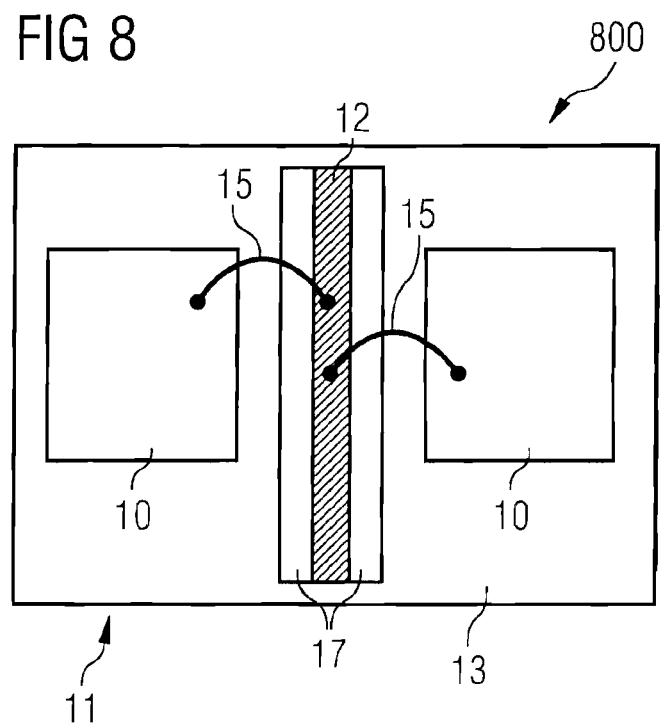
FIG. 8 shows a schematic illustration of a module 800 as a further exemplary embodiment of the invention.

FIG. 8 illustrates a module 800 in plan view as a further exemplary embodiment of the invention. In this exemplary embodiment, the carrier element 11 is formed integrally, in which case the regions 12 and 13 having different stiffnesses were produced by stamping out regions 17 from the carrier element 11. The regions 17 are two slots lying in the centre of the carrier element 11 in FIG. 8. The stamping out of the slots 17 gives rise to a first region 12 having a reduced stiffness in the form of a narrow bridge 12. The bridge 12 may be connected to the components 10 via wire connections 15.

The embodiment illustrated in FIG. 8 is advantageous particularly in the case where a plurality of components 10 are applied to the carrier element 11 and each of the components 10 is intended to be connected to a specific first region 12 having a low stiffness via wire connections 15. If the first region 12 were an edge region of the carrier element 11, a connection thereof to the components 10 could only be realized with longer wire connections 15. Generally, regions 12 having a lower stiffness can therefore be produced at any desired locations of the carrier element 11, thus giving rise to as many possibilities as desired for arranging the components 10 on the carrier element 11 and connecting them to the regions 12 having a low stiffness by means of short wire connections 15. Any desired architectures for the arrangement of the components 10 can thus be realized.

Figure 9:
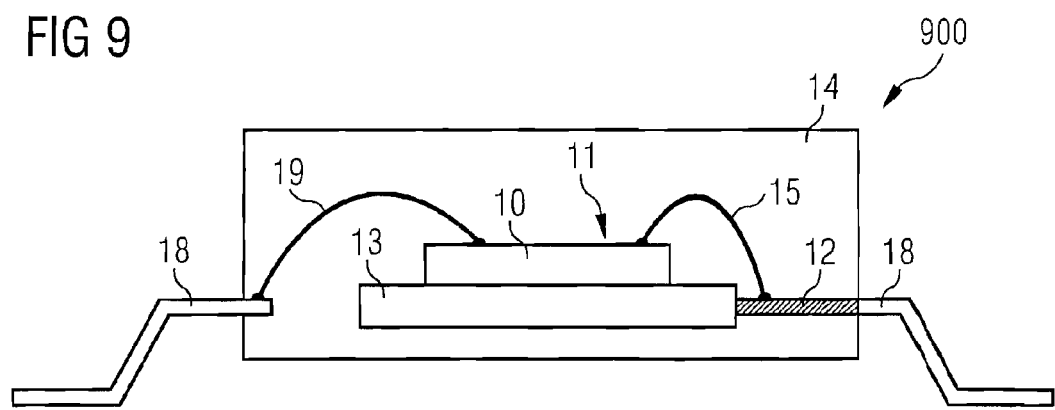
FIG. 9 shows a schematic illustration of a module 900 as a further exemplary embodiment of the invention.
Figure 10:
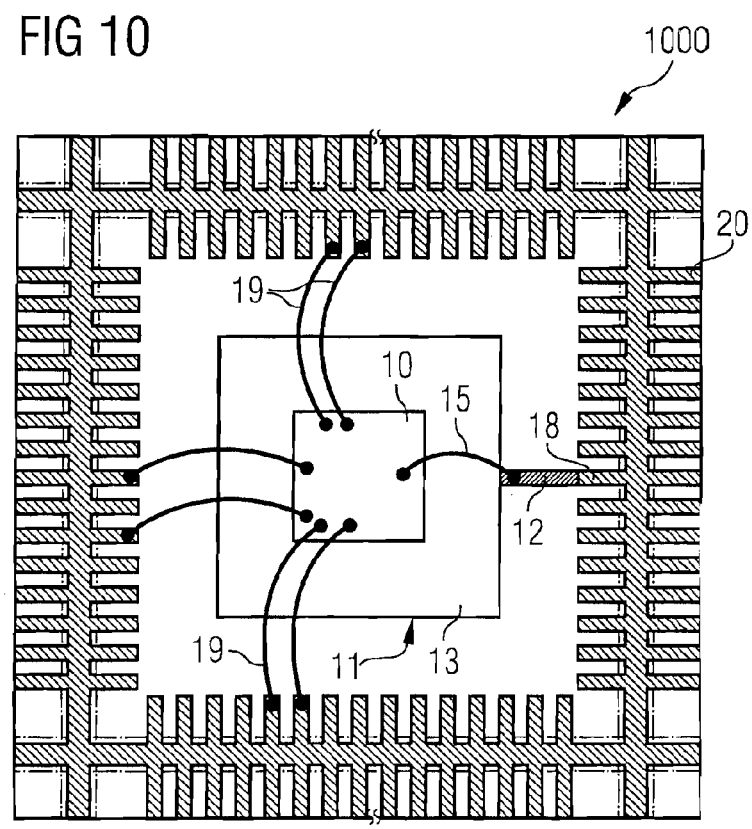
FIG. 10 shows a schematic illustration of a module 1000 as a further exemplary embodiment of the invention.

The external contact connections by means of which electrical contact can be made with the component 10 from outside the modules 100 to 800 were not illustrated in FIGS. 1 to 8 for reasons of clarity. By way of example, FIGS. 9 and 10 show modules 900 and 1000 which have been illustrated without omitting the external contact connections 18. The modules 100 to 800 may also be provided with external contact connections 18 in a corresponding manner.

FIG. 9 shows a cross section through the module 900 as a further exemplary embodiment of the invention. FIG. 9 illustrates two external contact connections 18 in the form of pins. The external contact connections 18 are arranged for example in grid-like fashion around the carrier element 11 and are electrically connected to contact elements of the carrier element 11 in each case via wire connections 19.

During the production of the module 900, the carrier element 11 together with the component 10 arranged thereon were enveloped by a potting material 14. Only the external contact connections 18 project by one of their ends in each case from the housing formed by the potting material 14. By means of these ends, the module 900 can for example be applied to a printed circuit board and be soldered there. By way of example, the carrier element 11 and the external contact connections 18 are part of a leadframe.

In the case of the module 900, one of the external contact connections 18 is connected to the carrier element 11 and formed integrally for example together with the carrier element 11. The section 12 of said external contact connection 18 which lies within the housing formed by the potting material 14 is a first region 12 having a low stiffness. A wire connection 15 leading to the component 10 is bonded onto the section 12.

FIG. 10 illustrates a module 1000 in plan view as a further exemplary embodiment of the invention. FIG. 10 shows the module 1000 during a production step. The module 1000 is surrounded by a leadframe 20 with external contact connections 18 arranged in grid-type fashion (illustrated in a hatched manner). At least one of the external contact connections 18 is connected to the carrier element 11. By way of example, the leadframe 20 together with the external contact connections 18 and the carrier element 11 are formed integrally. The external contact connection 18 which is connected to the carrier element 11 forms the first region 12, which, on account of its narrow and elongated form, has a lower stiffness than the carrier element 11 forming the second region 13.

FIG. 10 illustrates alongside the wire connection 15 by way of example further wire connections 19 which connect the contact elements of the component 10 to the pins of the leadframe 20 and via which electrical contact can be made with the component 10 externally after it has been completed.

The fact that in general at least one of the external contact connections 18 of a leadframe 20 is connected to the carrier element (die pad) 11 can be utilized during the production of the modules 900 and 1000. Said external contact connection 18 serves for example to hold the carrier element 11 in position during the production method 11. Such an external contact connection 18 connected to the carrier element 11 can be used without additional extra outlay during production as first region 12 having a low stiffness. It is merely necessary to produce a wire connection 15 from the component 10 to said external contact connection 18.

Furthermore, a fixed electrical potential, e.g. earth, may be applied from outside the module 900 or 1000 to the external contact connection 18 which is connected to the carrier element 11.

While the foregoing is directed to embodiments of the present invention, other and further embodiments of the invention may be devised without departing from the basic scope thereof, and the scope thereof is determined by the claims that follow.

What is claimed is:

1. A module, comprising:
   a carrier element having a lower stiffness in a first region than in a second region, wherein the first region is at least one cantilever disposed on the second region;
   a functional component disposed on the carrier element, the component having at least one electrical element;
   a wire connection from the component to the first region, the wire connection electrically coupling the component and the first region and configured to propagate a signal between the component to the first region; and
   a material covering the wire connection.

2. The module according to claim 1, wherein the first region is an edge region of the carrier element.

3. The module according to claim 1, wherein the carrier element has at least one external contact connection.

4. The module according to claim 1, at least one part of the carrier element being electrically conductive.

5. The module according to claim 1, wherein the component is fixed by means of an adhesive bond on the carrier element.

6. The module according to claim 1, further comprising an insulation layer being arranged between the component and the carrier element.

7. The module according to claim 1, wherein the first region and the second region of the carrier element are electrically connected to one another.

8. The module according to claim 1, wherein the carrier element has at least one external contact connection and wherein at least one of the first region, the second region and the at least one external contact connection are integrated with respect to each other.

9. The module according to claim 1, wherein the material further covers at least one of the carrier element and the component.

10. The module according to claim 1, wherein the at least one cantilever is formed in bar-type fashion.

11. The module according to claim 1, wherein the at least one cantilever is angled at least one location.

12. A module, comprising:
    a component having a length and width, the component having at least one electrical element;
    a carrier element, on which the component is disposed, the carrier element having a structure with a structure width less than the width of the component;
    a wire connection from the component to the structure, the wire connection electrically coupling the component and the structure and configured to propagate a signal between the component to the structure; and
    a material covering the wire connection.

13. The module according to claim 12, wherein the structure width is less than 5 mm.

14. The module according to claim 12, wherein the structure is at least one of a bridge and a cantilever and at least one external contact connection.

15. The module according to claim 12, wherein the structure is formed in an edge region of the carrier element.

16. The module according to claim 12, wherein the structure is formed essentially in bar-type fashion.

17. The module according to claim 12, wherein the structure tapers in a direction that points away from the carrier element.

18. The module according to claim 12, wherein the structure is angled at least one location.

19. The module according to claim 12, wherein the wire connection is a bonding wire.

20. The module according to claim 12, wherein the carrier element has at least one external contact connection and wherein at least one of the carrier element, the structure and the at least one external contact connection are integrated with respect to each other.

21. The module according to claim 12, wherein the carrier element has a fixed electrical potential and the fixed electrical potential is applied to the component via the wire connection.

* * * * *